United States Patent
Lu et al.

(10) Patent No.: US 9,269,893 B2
(45) Date of Patent: Feb. 23, 2016

(54) REPLACEMENT CONDUCTIVE HARD MASK FOR MULTI-STEP MAGNETIC TUNNEL JUNCTION (MTJ) ETCH

(71) Applicant: QUALCOMM Incorporated, San Diego, CA (US)

(72) Inventors: Yu Lu, San Diego, CA (US); Chando Park, San Diego, CA (US); Wei-Chuan Chen, Taipei (TW)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/243,324

(22) Filed: Apr. 2, 2014

(65) Prior Publication Data

US 2015/0287910 A1    Oct. 8, 2015

(51) Int. Cl.
| | |
|---|---|
| *H01L 43/12* | (2006.01) |
| *H01L 43/02* | (2006.01) |
| *H01L 43/08* | (2006.01) |

(52) U.S. Cl.
CPC ............... *H01L 43/12* (2013.01); *H01L 43/02* (2013.01); *H01L 43/08* (2013.01)

(58) Field of Classification Search
CPC ......... H01L 43/12; H01L 43/08; H01L 43/02; H01L 27/222
See application file for complete search history.

(56) References Cited

U.S. PATENT DOCUMENTS

| | | | |
|---|---|---|---|
| 8,338,869 B2 | 12/2012 | Gaidis | |
| 9,070,869 B2 * | 6/2015 | Jung | ...................... H01L 27/222 |
| 2004/0229430 A1 | 11/2004 | Findeis et al. | |
| 2005/0090056 A1 * | 4/2005 | Lee | .......................... H01L 43/12 438/257 |
| 2011/0235217 A1 | 9/2011 | Chen et al. | |
| 2012/0205764 A1 | 8/2012 | Chen et al. | |
| 2013/0034917 A1 | 2/2013 | Lee | |
| 2013/0241015 A1 | 9/2013 | Nomachi | |

OTHER PUBLICATIONS

International Search Report and Written Opinion—PCT/US2015/020750—ISA/EPO—Jun. 19, 2015.

* cited by examiner

*Primary Examiner* — Yasser A Abdelaziez
*Assistant Examiner* — Farun Lu
(74) *Attorney, Agent, or Firm* — Seyfarth Shaw LLP (57) ABSTRACT

A multi-step etch technique for fabricating a magnetic tunnel junction (MTJ) apparatus includes forming a first conductive hard mask on a first electrode of the MTJ apparatus for etching the first electrode during a first etching step. The method also includes forming a second conductive hard mask on the first conductive hard mask for etching magnetic layers of the MTJ apparatus during a second etching step. A spacer layer is conformally deposited on sidewalls of the first conductive hard mask. The second conductive hard mask is deposited on the first conductive hard mask and aligned with the spacer layer on the sidewalls of the first conductive hard mask.

13 Claims, 12 Drawing Sheets

REPLACEMENT CONDUCTIVE HARD MASK FOR MULTI-STEP MAGNETIC TUNNEL JUNCTION (MTJ) ETCH

TECHNICAL FIELD

The present disclosure generally relates to magnetic tunnel junction (MTJ) devices. More specifically, the present disclosure relates to fabricating high density arrays of magnetic random access memory (MRAM) devices.

BACKGROUND

Unlike conventional random access memory (RAM) chip technologies, in magnetic RAM (MRAM) data is stored by magnetization of storage elements. The basic structure of the storage elements consists of metallic ferromagnetic layers separated by a thin tunneling barrier. Typically, the ferromagnetic layers underneath the barrier (e.g., the pinned layer) have a magnetization that is fixed in a particular direction. The ferromagnetic magnetic layers above the tunneling barrier (e.g., the free layer) have a magnetization direction that may be altered to represent either a "1" or a "0." For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

MRAM is a non-volatile memory technology that uses magnetic elements. For example, spin transfer torque magnetoresistive random access memory (STT-MRAM) uses electrons that become spin-polarized as the electrons pass through a thin film (spin filter). STT-MRAM is also known as spin transfer torque RAM (STT-RAM), spin torque transfer magnetization switching RAM (Spin-RAM), and spin momentum transfer (SMT-RAM).

Bitcells of a magnetic random access memory may be arranged in one or more arrays including a pattern of memory elements (e.g., MTJs in case of MRAM). Spin-transfer-torque magnetic random access memory (STT-MRAM) is an emerging nonvolatile memory that has advantages of non-volatility. In particular, STT-MRAM operates at a higher speed than off chip dynamic random access memory (DRAM). In addition, STT-MRAM has a smaller chip size than embedded static random access memory (eSRAM), unlimited read/write endurance, and a low array leakage current.

SUMMARY

A method of fabricating a magnetic tunnel junction (MTJ) apparatus according to an aspect of the present disclosure includes conformally depositing a first spacer layer on a first conductive hard mask, on a first electrode layer, and on magnetic layers of the MTJ. A first portion of the first spacer layer is deposited on sidewalls of the first conductive hard mask and a second portion of the spacer layer is deposited on a surface of the first conductive hard mask. The method also includes selectively removing the second portion of the first spacer layer to create a recess within a dielectric layer, which is aligned with the first portion of the first spacer layer. According to this aspect of the present disclosure, the method also includes filling the recess with a conductive material to form a second conductive hard mask on the first portion of the first spacer layer and on the first conductive hard mask.

An MTJ apparatus according to an aspect of the present disclosure includes a first conductive hard mask on a second electrode layer. The second electrode layer is on a stack of MTJ layers and is electrically coupled to the stack of MTJ layers. The MTJ apparatus includes a first spacer on sidewalls of the first conductive hard mask, sidewalls of the second electrode layer, and a surface of the stack of MTJ layers. According to this aspect of the present disclosure, the MTJ apparatus also includes a second conductive hard mask aligned with sidewalls of the first spacer. The second conductive hard mask is on the first conductive hard mask and on the first spacer.

An MTJ apparatus according to another aspect of the present disclosure includes first means for masking a first electrode layer that is coupled to a stack of MTJ layers and for providing a conductive path to the first electrode layer. The first masking means abuts the first electrode layer. The MTJ apparatus also includes means for protecting sidewalls of the first means. The protecting means abuts the sidewalls of the first means, sidewalls of the first electrode layer, and a surface of the stack of MTJ layers. According to this aspect of the present disclosure, the MTJ apparatus also includes second means for masking the stack of MTJ magnetic layers and for electrically coupling to the first conductive path. The second means are aligned with sidewalls of the first means and abuts a surface of the first means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Figure 3:
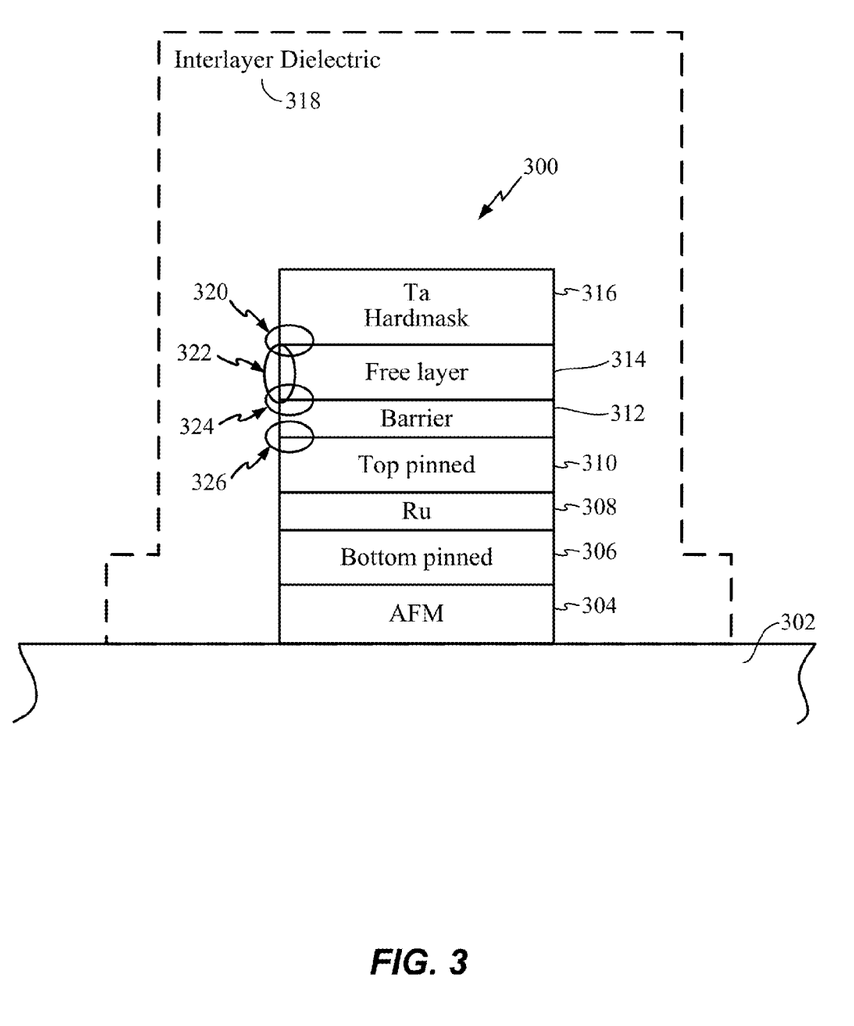
FIG. 3 is a schematic cross-sectional view of a conventional MTJ stack, illustrating portions of the MTJ stack susceptible to process related damage.

A memory device such as MRAM is built from an array of individually addressable magnetic tunnel junction (MTJs). An MTJ stack may include a free layer, a fixed layer and a tunnel barrier layer there between as well as one or more ferromagnetic layers. The MTJ stack is susceptible to damage during the etching process due to re-deposition of etching byproducts. For example, removal of photoresist may include processes such as oxygen ashing. Oxygen ashing can cause damage to the hard mask layer (e.g., an electrode layer) during the photoresist removal process. Oxygen ashing can also cause damage to upper portions of the sidewalls of the free layer of the MTJ stack. An etching process proceeds from etching the hard mask layer of the MTJ stack 300 to etching the fixed layers (e.g., pinned) of the stack. As the etching process progresses through the MTJ stack, damage can be caused to the sidewalls 322 of the free layer 314. As the etching process proceeds further, upper portions and lower portions of the sidewalls of the tunneling barrier layer may also be damaged.

Non-volatile byproducts of the etching process may also settle as re-deposited films around the sidewalls of the MTJs of a memory device. The re-deposited films may act as leakage paths along the sidewalls, thereby reducing the magnetic resistance (MR) ratio of the MTJ. Such process related damages may result in significantly lower yields. Existing techniques do not provide an effective solution for protecting MTJs from at least all these process related damages.

A method of implementing a two-step MTJ etching process according to an aspect of the present disclosure is described. In this aspect of the disclosure, a spacer is protected during a second etching step.

Figure 1:
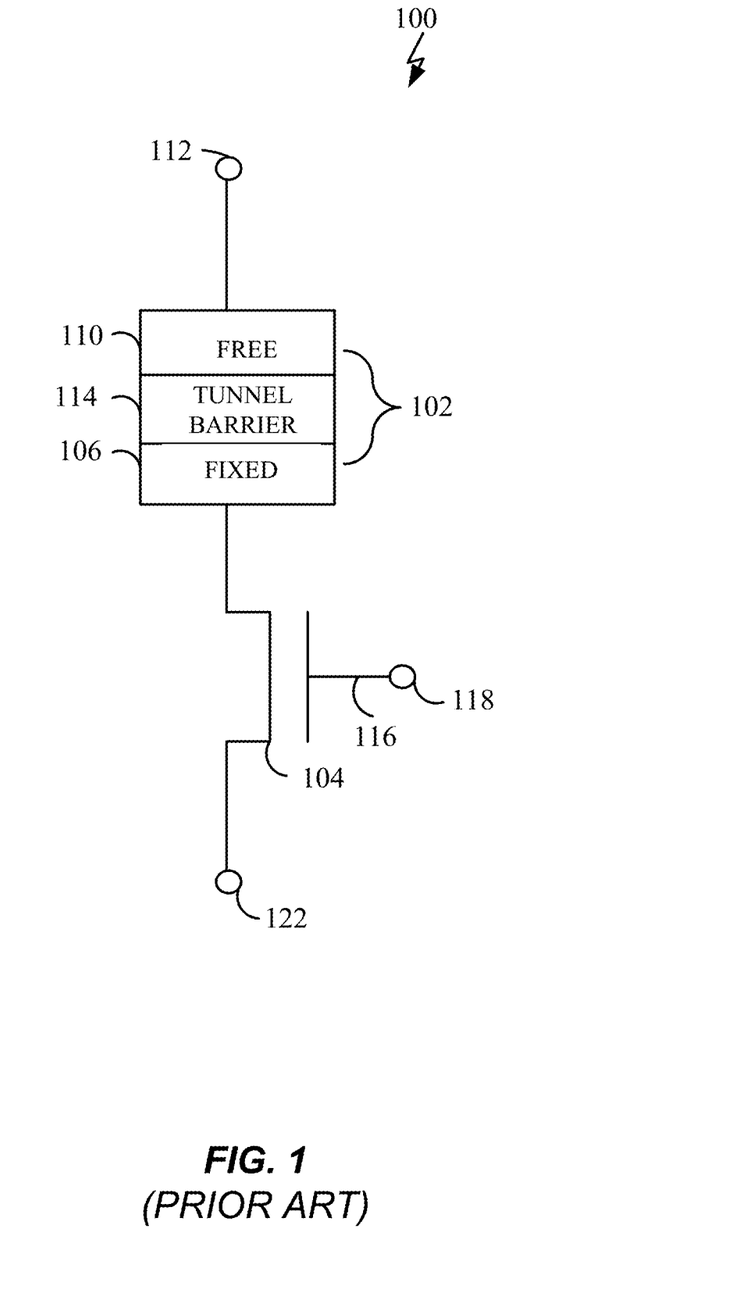
FIG. 1 is a diagram of a magnetic tunnel junction (MTJ) device connected to an access transistor.

FIG. 1 illustrates a memory cell 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a cobalt-iron-boron (CoFeB) layer, a ruthenium (Ru) layer and a cobalt-iron (CoFe) layer. In addition, the free layer 110 may be an anti-ferromagnetic material, such as CoFeB, and the tunnel barrier layer 114 may be magnesium oxide (MgO).

Figure 2:
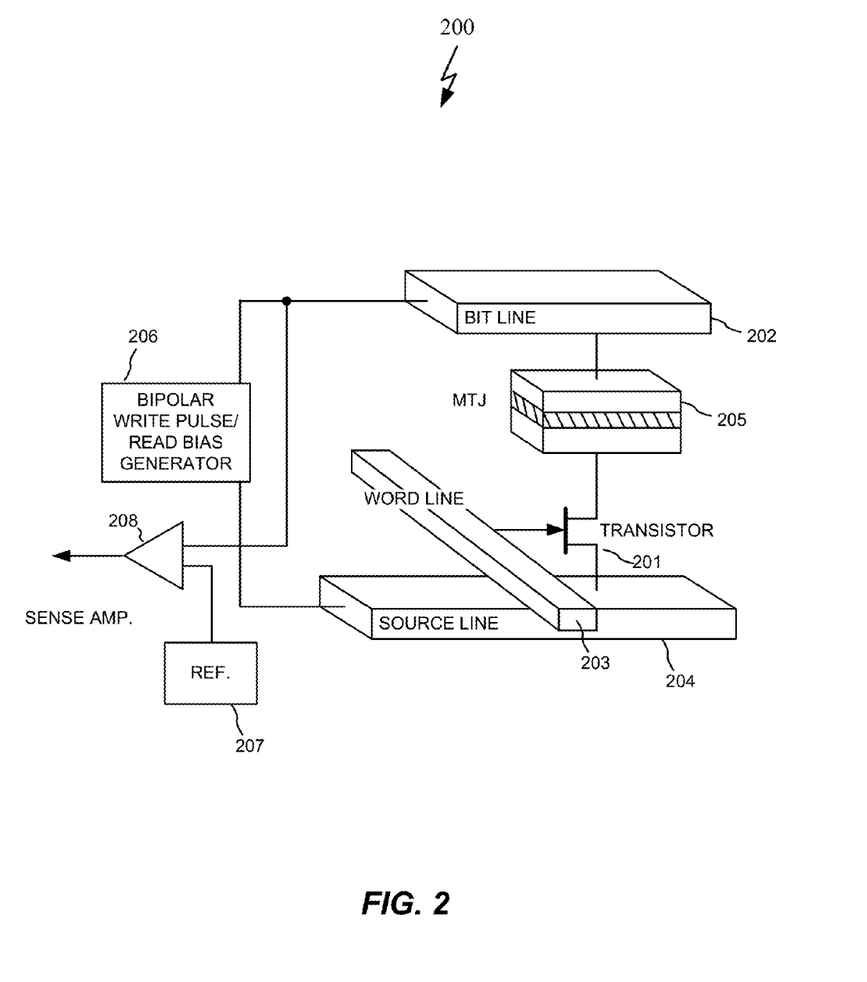
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 205, a transistor 201, a bit line 202 and a word line 203. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may be used to program and read the bit cell 200. The STT-MRAM bit cell 200 also includes a source line 204, a sense amplifier 208, read/write circuitry 206 and a bit line reference 207.

As shown in FIG. 3, conventional MTJ storage elements generally are formed on an electrode 302 (e.g., a bottom electrode) such as a semiconductor substrate (e.g., of Si). One or more seed layers (not shown) may be formed on the electrode 302. Generally, an antiferromagnetic (AFM) layer 304 is first formed on the electrode 302, and then a first ferromagnetic layer is formed on of the AFM layer 304. The first ferromagnetic layer is "pinned" with a fixed magnetization to form a pinned layer. The pinned layer may include one or more layers, such as a first pinned layer 306 (e.g., a bottom pinned layer), a coupling layer 308 typically formed of a non-magnetic metal such as ruthenium (Ru), and a second pinned layer 310 (e.g., a top pinned layer). A tunneling barrier layer 312, including an insulator (e.g., a metal oxide), is formed on the second pinned layer 310. A free layer 314 of a second ferromagnetic layer is formed directly on the tunneling barrier layer 312. A hard mask layer 316 (e.g., a top electrode of tantalum) is formed on the free layer 314.

In this process, the MTJ stack 300 is subjected to a magnetic annealing process in a vacuum. A pattern is then applied to the MTJ stack using a lithography technique. A photoresist (not shown in FIG. 3) is formed on the hard mask layer 316. The patterned cell size may be larger than the final size. Each of the aforementioned layers may include one or more layers or films.

Next, the MTJ stack 300 is etched using an etching process such as reactive ion etching. The etching process includes trimming the size of the photoresist, patterning the hard mask layer 316, removing the photoresist, etching the free layer 314, etching the tunneling barrier layer 312, etching the first pinned layer 306, the coupling layer 308 and the second pinned layer 310, and etching the AFM layer 304. Next, a passivation layer is deposited to protect the MTJ storage element and the interlayer dielectric (ILD) insulator layer 318. A combination stack may be specified, along with a low deposition temperature to protect the MTJ and promote adhesion between the MTJ and the ILD. Finally, planarization and metallization is performed.

The MTJ stack 300 is susceptible to damage during the etching process due to redeposition of etching byproducts. For example, removal of photoresist may include processes such as oxygen ashing. Oxygen ashing can cause damage to the hard mask layer 316 during the photoresist removal process. Oxygen ashing can also cause damage to upper portions 320 of sidewalls of the free layer 314. As described above, the etching process proceeds from etching the hard mask layer 316 at the top of the MTJ stack 300 towards etching the pinned layers at the bottom of the stack. As the etching process progresses deeper down the MTJ stack, damage can be caused to sidewalls 322 of the free layer 314. As the etching process proceeds further down the stack, the upper portions 324 and lower portions 326 of the sidewalls of the tunneling barrier layer 312 may also be damaged.

Non-volatile byproducts of the etching process may settle as re-deposited films around the sidewalls of MTJ devices. The re-deposited films may act as leakage paths along the sidewalls, thereby reducing the magnetic resistance (MR) ratio of the MTJ. Such process related damages may result in significantly lower yields. Existing techniques do not provide an effective solution for protecting MTJs from at least all the process related damages described above.

One technique for reducing the detrimental effects of re-deposited films is ion beam etching at shallow angles, with multiple steps at different ion incident angles. The shallow angle step cleans the sidewall re-deposition. Unfortunately, the use of such directional etching techniques becomes increasingly difficult as height to space ratios of MTJs increase along with MTJ density in current high density of MTJ arrays.

A second technique for reducing the detrimental effects of re-deposited films is single step etching, which relies on etch optimization to reduce sidewall re-deposition. The etch optimization is sensitive to MTJ material, size, and spacing. The final etch profile is generally tapered to reduce sidewall re-deposition. The tapered etch profile may result in reduced density of MTJs in a high density MTJ array.

A third technique for reducing the detrimental effects of re-deposited films and the detrimental effects of plasma damage is two-step etching, in which a first step etches down to the tunnel barrier only. The sidewall of the MTJ is then encapsulated in dielectric material. Through either a second lithography level or a spacer masking process, an etch mask overlapping the MTJ is formed after the first etching step. This etch mask is then used to etch the remaining MTJ stack materials. This technique physically separates the re-deposition material and the plasma for a second part of the etch from the active magnetic layer and the tunnel barrier region.

Figure 4A:
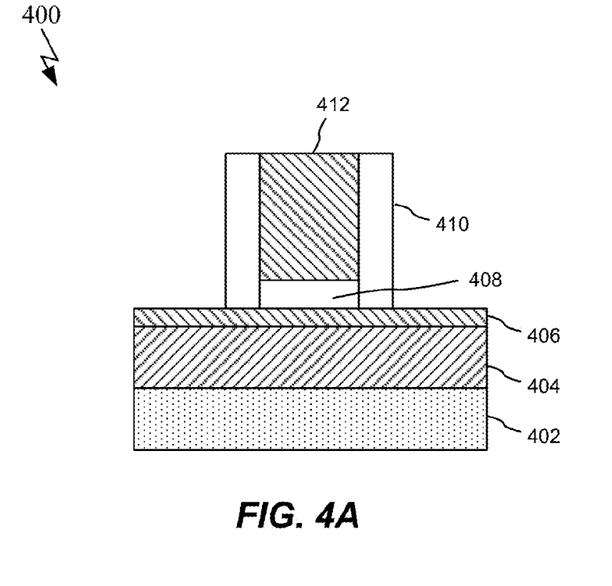
FIGS. 4A-4B are schematic cross-sectional views of a partially fabricated MTJ structure illustrating a currently known two-step etching technique for protecting the MTJ stack from process related damage.
Figure 4B:
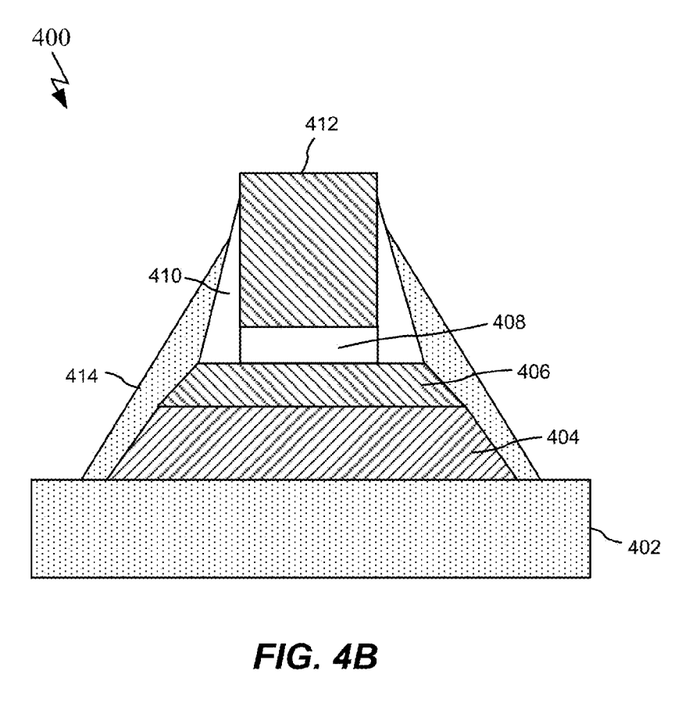

An example of a currently known two-step technique for etching an MTJ, which attempts to reduce detrimental effects of re-deposited films and plasma damage, is described with reference to FIGS. 4A and 4B. FIG. 4A, illustrates layers of an MTJ structure 400 after a first etching step. The MTJ structure 400 includes a substrate 402, a bottom electrode layer 404, magnetic layers 406, a top electrode 408, a spacer 410 and a conductive hard mask 412. In this example, a first etching step stops on the magnetic layers 406 of the MTJ and forms the spacer 410 around sides of the top electrode 408 and the conductive hard mask 412 of the MTJ.

A second etching step stops on the substrate 402 and defines the lateral dimensions of the magnetic layers 406 and the bottom electrode layer 404 of the MTJ. Unfortunately, lithographic etching techniques for performing the second etching step in high-density MTJ arrays are difficult to implement. Moreover, the use of lithographic etching techniques for the second etching step can add an additional mask level and associated costs to the fabrication process.

A spacer defined etching process using SiNx (silicon nitride) or SiOx (silicon oxide) as the spacer material has been performed in the semiconductor industry. Unfortunately, SiNx and SiOx are not strongly resistant to the etchants and processes that are used to etch the magnetic layers 406 and the bottom electrode layer 404 of the MTJ. Thus, as shown in FIG. 4B, a spacer 410 made from SiNx or SiOx is significantly eroded during a spacer defined second etching step. The erosion of the spacer 410 results in a tapered etch profile and permits re-deposition films 414 to come into close proximity with the bottom electrode layer 404, the magnetic layers 406 and/or the conductive hard mask 412 of the MTJ. Thus, the re-deposition films 414 may still facilitate shunting between these layers and detrimentally affect the electrical resistance characteristics of the MTJ.

Figure 5A:
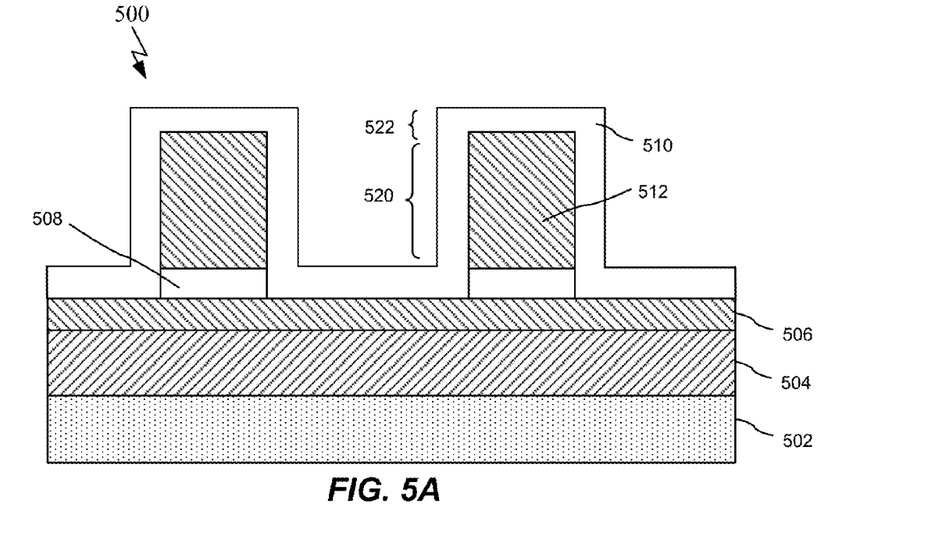
FIGS. 5A-5J are schematic cross-sectional views of an MTJ structure during fabrication according to aspects of the present disclosure.

A method of implementing a multi-step MTJ etching process, in which the spacer is protected during a second etching step according to an aspect of the present disclosure, is described in FIGS. 5A-5J. FIG. 5A illustrates layers of an MTJ structure 500 after a first etching step and deposition of the spacer film according to an aspect of the present disclosure. The MTJ structure 500 includes a substrate 502, a first electrode layer 504 deposited on the substrate 502 of the MTJ. The MTJ structure 500 also includes a magnetic layer 506 deposited on the first electrode layer 504, a second electrode layer 508 deposited on the magnetic layers 506, a first conductive hard mask 512 layer deposited on the second electrode layer 508 and an first spacer layer 510 deposited over the first conductive hard mask 512.

The first etching step defines the lateral dimensions of the second electrode layer 508 and the first conductive hard mask. The first spacer layer 510 is deposited after the first etching step. The first spacer layer 510 is deposited on the first conductive hard mask 512, on the second electrode layer 508, and on the magnetic layers 506 of the MTJ. In one configuration, a first portion 520 of the first spacer layer 510, which abuts sidewalls of the first conductive hard mask 512, is thinner than a second portion 522 of the first spacer layer 510, which abuts a top surface of the first conductive hard mask 512. This can be achieved by reducing the level of conformality during deposition of the first spacer layer 510, for example, by changing the chamber pressure or the bias power. The first spacer layer 510 may be SiNx. The thickness of the first portion 520 of the first spacer layer 510 may be about 10-50 nanometers and the thickness of the second portion 522 of the first spacer layer 510 may be greater than 50 nanometers. The greater thickness of second portion 522 of the first spacer layer 510 may provide increased process margins for subsequent planarization processes, for example.

Figure 5B:
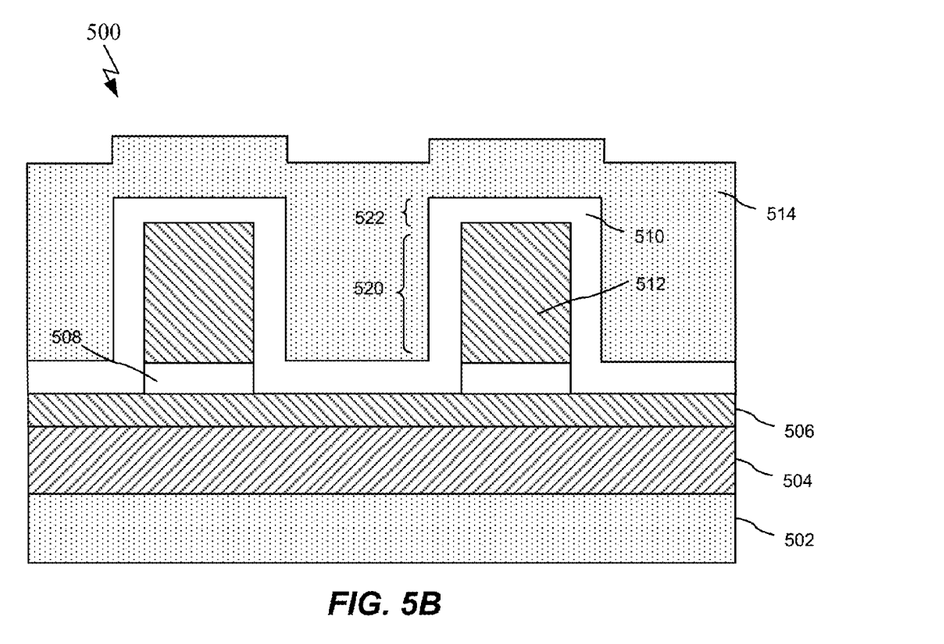

FIG. 5B shows a schematic cross-sectional view further illustrating the MTJ structure 500 during fabrication according to an aspect of the present disclosure. In this configuration, a first dielectric layer 514 is deposited on the first spacer layer 510. In this example, first dielectric layer 514 is deposited on the first spacer layer 510 after the first spacer layer 510 is conformally deposited on the first conductive hard mask 512, on the second electrode layer 508 and on the magnetic layers 506 of the MTJ.

Figure 5C:
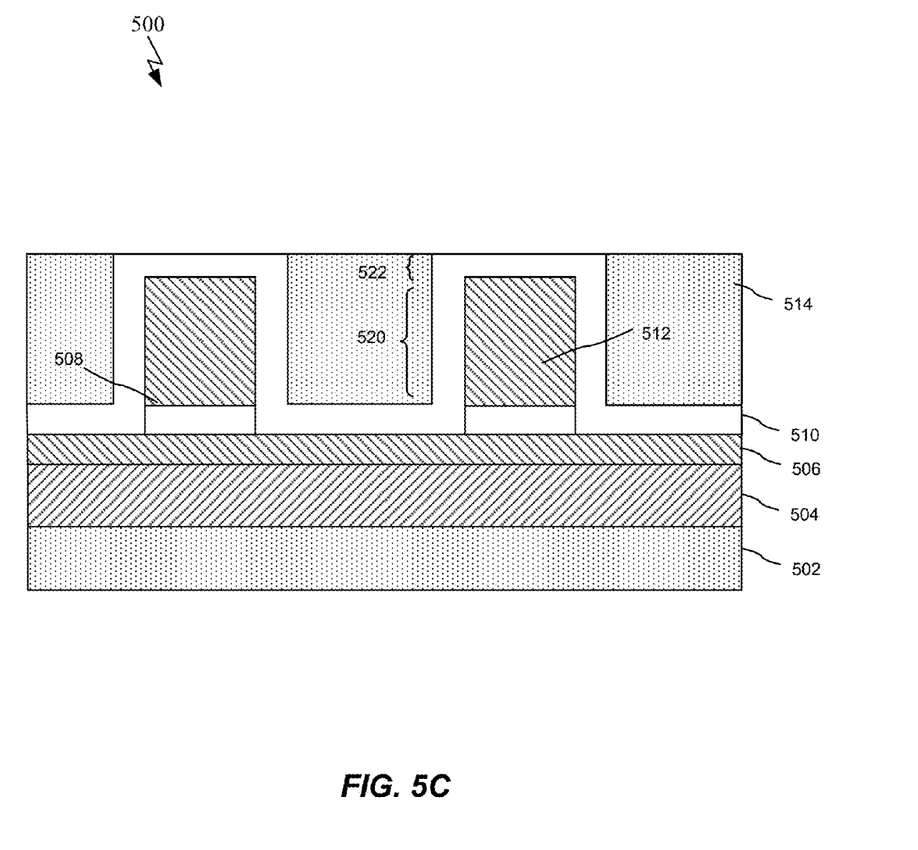

FIG. 5C shows a schematic cross-sectional view further illustrating the MTJ structure 500 during fabrication according to an aspect of the present disclosure. In this configuration, the first dielectric layer 514 is planarized using well known methods such as a chemical mechanical planarization process. Planarization of the first dielectric layer 514 stops on the first spacer layer 510 and forms a surface of the first dielectric layer 514 that is substantially co-planar with the surface of the second portion 522 of the first spacer layer 510.

A planarization process that stops on a nitride layer, such as the first spacer layer 510, while reducing or even minimizing oxide dishing may include the use of a selective slurries, reduced forces and/or higher speeds to improve planarization performance. Examples of techniques for improving planarization performance that may be applied to the step of planarizing the first dielectric layer 514 to stop at the first spacer layer 510 according to aspects of the present disclosure are described in Withers et al., "Wide margin CMP for STI", Solid State Technology, 0038111X, July 98, Vol. 41, Issue 7, the disclosure of which is expressly incorporated by reference herein in its entirety.

Figure 5D:
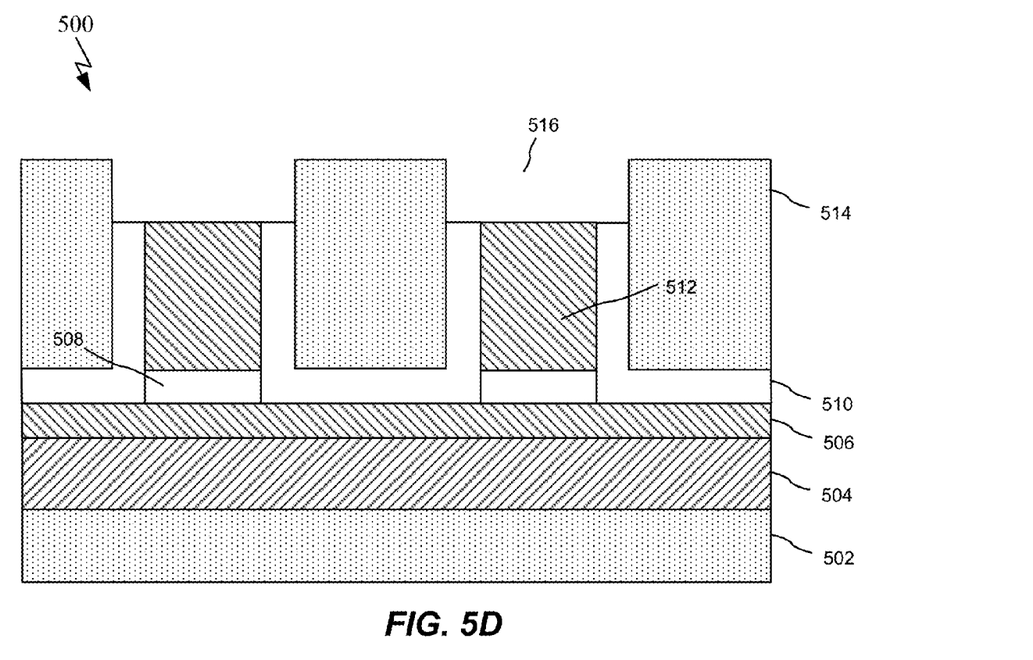

In FIG. 5D, the second portion 522 of the first spacer layer 510 is selectively removed. This step can be performed using currently known processes such as the highly selective etching of SiNx in well-known gate spacer processes, for example. Examples of highly selective etching of SiNx are described in Sunghoon Lee et al., JVacSciTEch B 20(1), P131-7, 2010. A recess 516 in the first dielectric layer 514 is formed by removal of the second portion 522 of the first spacer layer 510. The recess 516 is aligned with the outside vertical surface of the first portion 520 of the first spacer layer 510, and overlaps the first conductive hard mask 512 and the second electrode layer 508.

In this aspect of the present disclosure, the material of the first dielectric layer 514 is selected for having properties that allow the selective removal of the first spacer layer 510 material to form the recess 516 within the first dielectric layer 514. In one example, the material of the first dielectric layer 514 is SiOx.

Figure 5E:
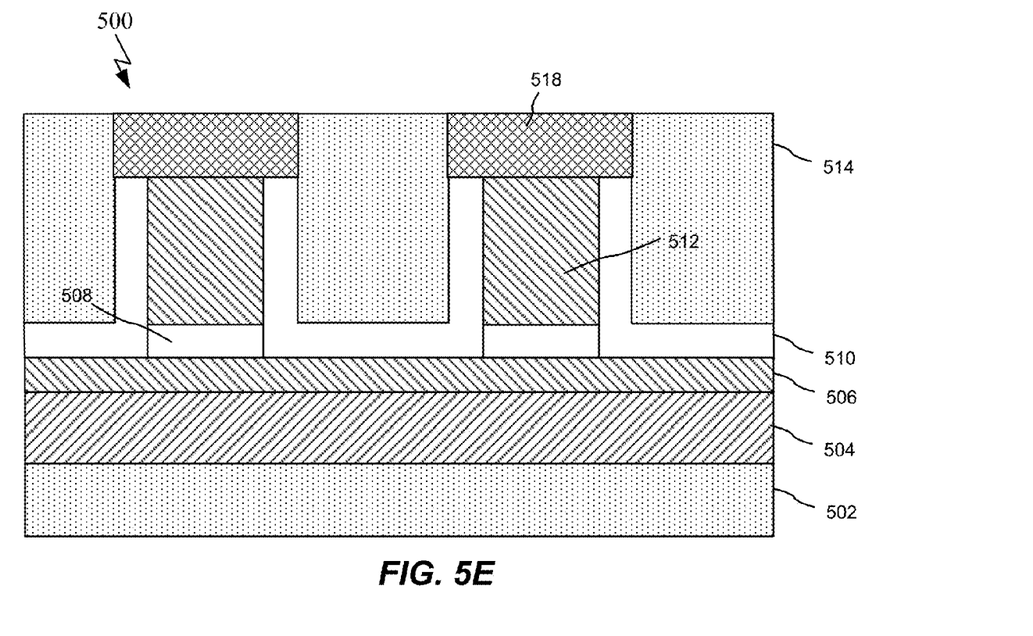

FIG. 5E further illustrates the MTJ structure 500 during fabrication according to an aspect of the present disclosure. In this configuration, the recess 516 is filled with a second conductive hard mask 518. Filling of the recess 516 with the second conductive hard mask 518 may be performed after removal of the second portion 522 of the first spacer layer 510. The second conductive hard mask may be, for example, tantalum, hafnium, or platinum. The material selection is based on the etching chemistry to be used. The material can be treated so that it is further resistant to the etching chemicals. A common planarization processes, such as chemical mechanical polishing (CMP), removes excess materials outside of the recess 516, such that the resulting second conductive hard mask 518 is also aligned with the outside extent of the first portion 520 of the first spacer layer 510.

Figure 5F:
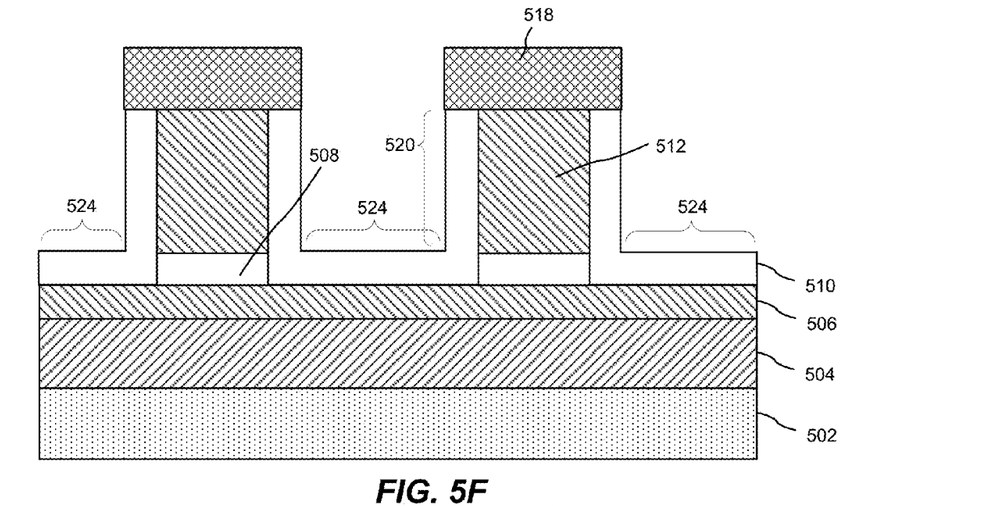

In FIG. 5F, the first dielectric layer 514 is removed after the recess 516 is filled with a second conductive hard mask 518. The first dielectric layer 514 may be removed by plasma etching, for example. In this configuration, removal of the first dielectric layer 514 leaves the second conductive hard mask 518 aligned with the first portion 520 of the first spacer layer 510, and overlapping the first conductive hard mask 512 and the second electrode layer 508. At this stage, remaining portions of the first spacer layer 510 include the first portion 520 that abuts sidewalls of the first conductive hard mask and the second electrode layer 508. Other portions of the first spacer layer 510 include the third portions 524 that abut the magnetic layers 506 of the MTJ where the magnetic layers 506 are not overlapped by the second conductive hard mask 518.

Figure 5G:
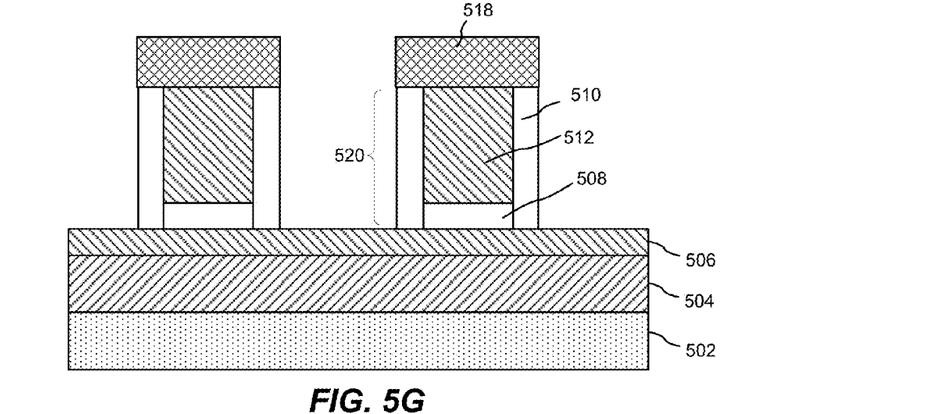

In FIG. 5G, the third portions 524 of the first spacer layer 510 are removed after the first dielectric layer 514 is removed with an anisotropic etch. In one example, the first dielectric layer is a SiNx material. The third portions 524 of the first spacer layer 510 may be removed by plasma etching of the SiNx material. The second conductive hard mask 518 may prevent the second portion 522 of the first spacer layer 510 from being removed during this step.

Figure 5H:
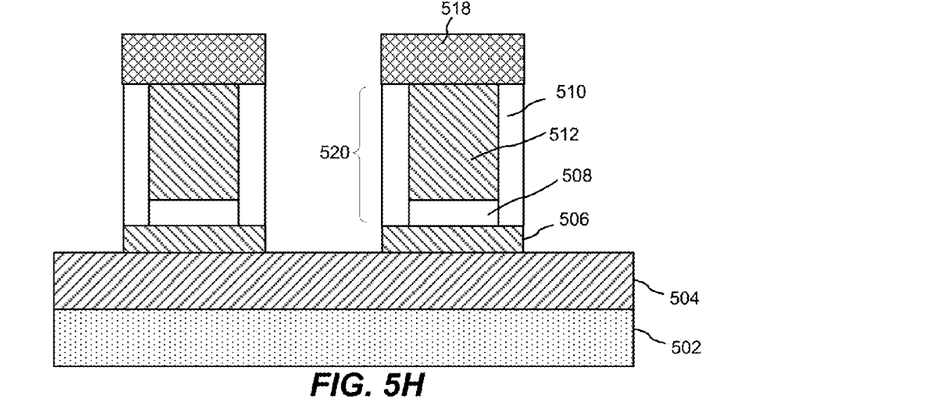

In FIG. 5H, the magnetic layers 506 of the MTJ are etched during a second etching step after the third portions 524 of the first dielectric layer 514 are removed. This step may be performed by reactive ion etching, or ion beam etching, for example. The magnetic layers 506 of the MTJ are masked by the second conductive hard mask 518 during this etching step so the lateral dimensions of the magnetic layers 506 are substantially aligned with the lateral dimensions of the second conductive hard mask 518. Thus, the magnetic layers 506 of the MTJ are etched in a pattern defined by the second conductive hard mask 518. According to an aspect of the present disclosure, the top surface of the second conductive hard mask 518 may be modified to enhance etch resistance to this second etching step.

Figure 5I:
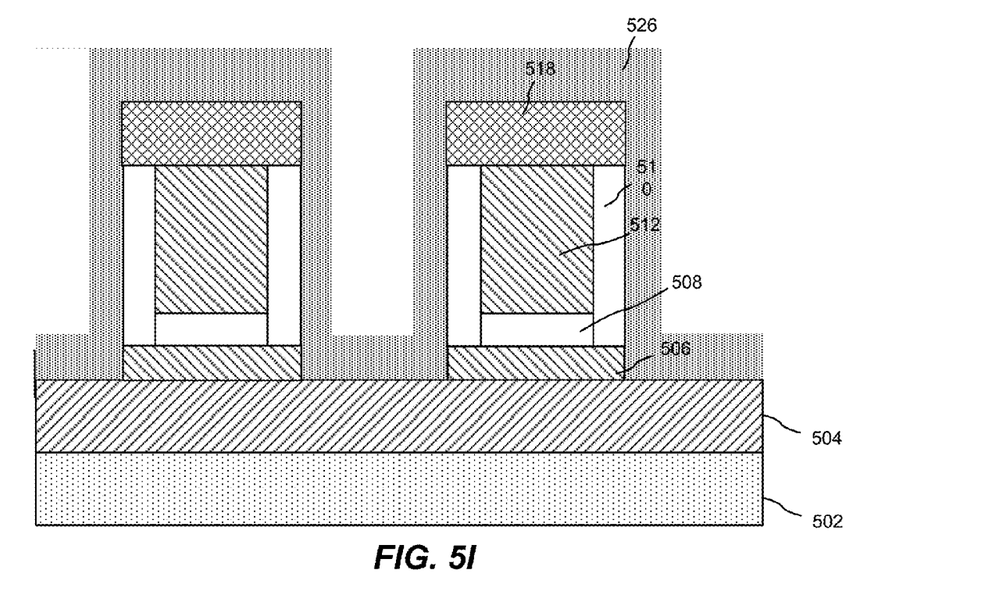

In FIG. 5I, a second spacer layer 526 is conformally deposited over the second conductive hard mask 518, the second portions 522 of the first spacer layer 510, the magnetic layer 506 and the first electrode layer 504. The second spacer layer 526 may be conformally deposited after the magnetic layers 506 of the MTJ are etched. The second spacer layer 526 may be a SiNx material, for example. The second spacer layer 526 and the second portion of the first spacer layer 510 protect the second electrode layer 508, the magnetic layers 506 and the first electrode layer 504 from re-deposition films, oxidation, tool contamination, etc.

Figure 5J:
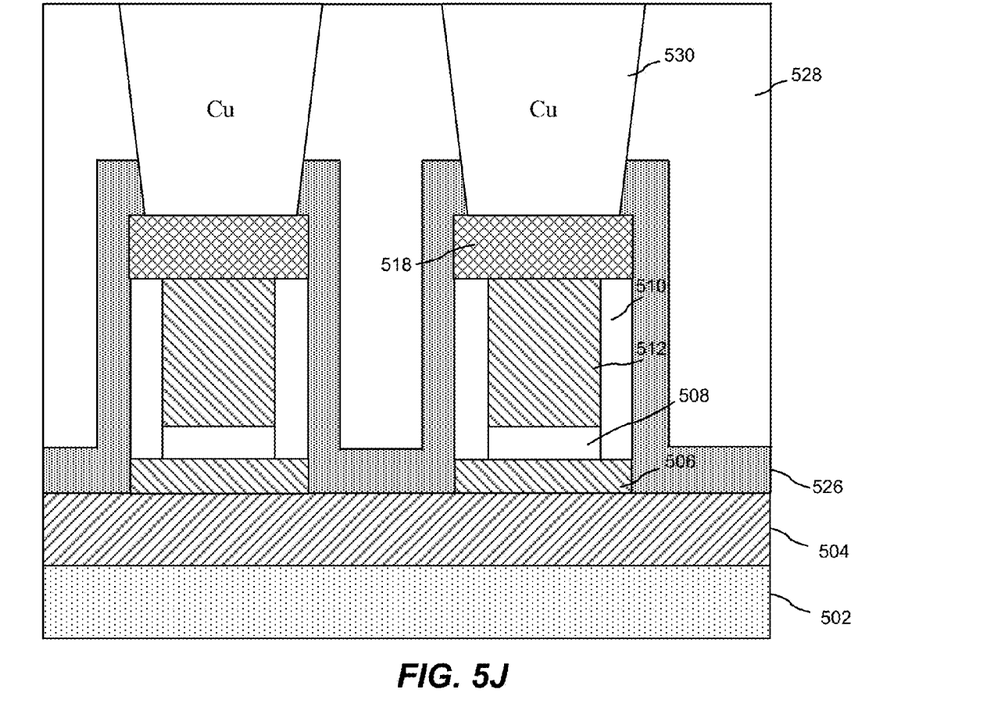

FIG. 5J shows a schematic cross-sectional view illustrating the MTJ structure 500 after fabrication according to an aspect of the present disclosure. In this configuration, a second dielectric layer 528 is deposited over the second spacer layer after the second spacer layer is conformally deposited. The second dielectric layer 528 may be a SiOx material, for example. The second dielectric layer 528 may then be planarized using a conventional chemical mechanical planarization process. A conductive interconnect 530 may be formed in the second dielectric layer 528 and coupled to the second conductive hard mask 518 to provide a conductive path to the first conductive hard mask 512 and the second electrode layer 508. The conductive interconnect may be a conventionally formed Cu interconnect, for example.

Figure 6:
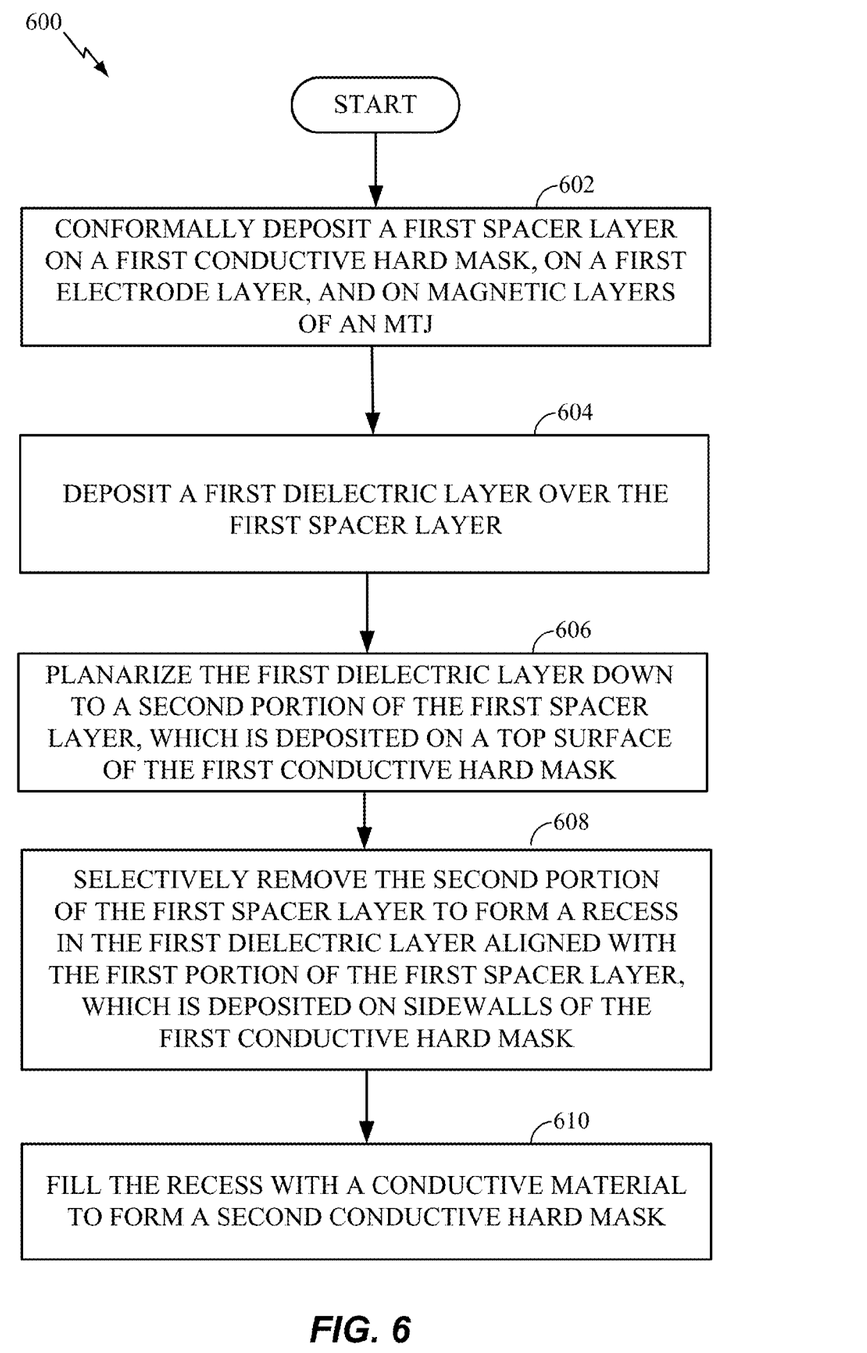
FIG. 6 is a process flow diagram illustrating an exemplary method of constructing an MTJ structure according to aspects of the present disclosure.

FIG. 6 is a process flow diagram illustrating a method of fabricating a magnetic tunnel junction (MTJ) apparatus according to an aspect of the present disclosure. It should be noted that the following description does not necessarily reflect the actual sequence of film growth. The method 600 includes conformally depositing a first spacer layer on a first conductive hard mask, on a top electrode, and on magnetic layers of the MTJ at block 602. A first portion of the first spacer layer is deposited on sidewalls of the first conductive hard mask and a second portion of the spacer layer is deposited on a top surface of the first conductive hard mask. At block 604, the method includes depositing a first dielectric layer over the first spacer layer. At block 606, the method includes planarizing the first dielectric layer down to the second portion of first spacer layer. At block 608, the second portion of the spacer layer is selectively removed to form a recess within the first dielectric layer. According to an aspect of the disclosure, the recess is aligned with the first portion of the first spacer layer. At block 610, the recess is filled with a conductive material to form a second conductive hard mask on the first portion of the first spacer layer and on the first conductive hard mask.

An MTJ apparatus according to another aspect of the present disclosure includes a first means for masking a top electrode that is coupled to a stack of MTJ layers and for providing a conductive path to the top electrode. The first means for masking the top electrode and providing a conductive hard mask may include the first conductive hard mask 512 that is described above with respect to FIGS. 5A-5J, for example. According to this aspect of the disclosure, the apparatus also includes a means for protecting sidewalls of the first means. The protecting means may include the first spacer layer 510 that is described in FIGS. 5A-5J, for example. According to this aspect of the disclosure, the apparatus also includes second means for masking the stack of MTJ magnetic layers and for electrically coupling to the first conductive path. The second means for masking the stack of MTJ magnetic layers and for electrically coupling to the first conductive path may include the second conductive hard mask 518 that is in FIGS. 5E-5J, for example.

In another configuration, the aforementioned means may be any material or any layer configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
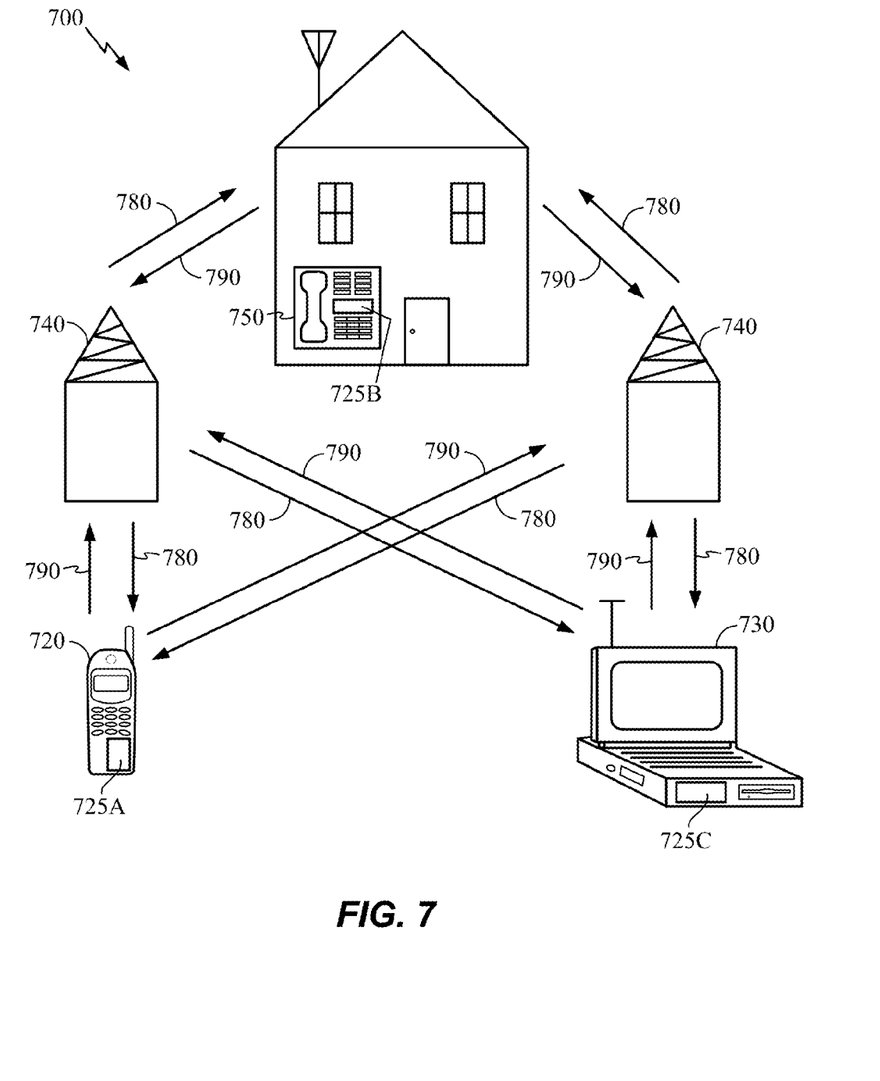
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C and 725B that include the disclosed MTJ apparatus. It will be recognized that other devices may also include the disclosed MTJ apparatus, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the teachings of the disclosure, the disclosure is not limited to these exemplary illustrated units. Aspects of the disclosure may be suitably employed in many devices, which include MTJ apparatus.

Figure 8:
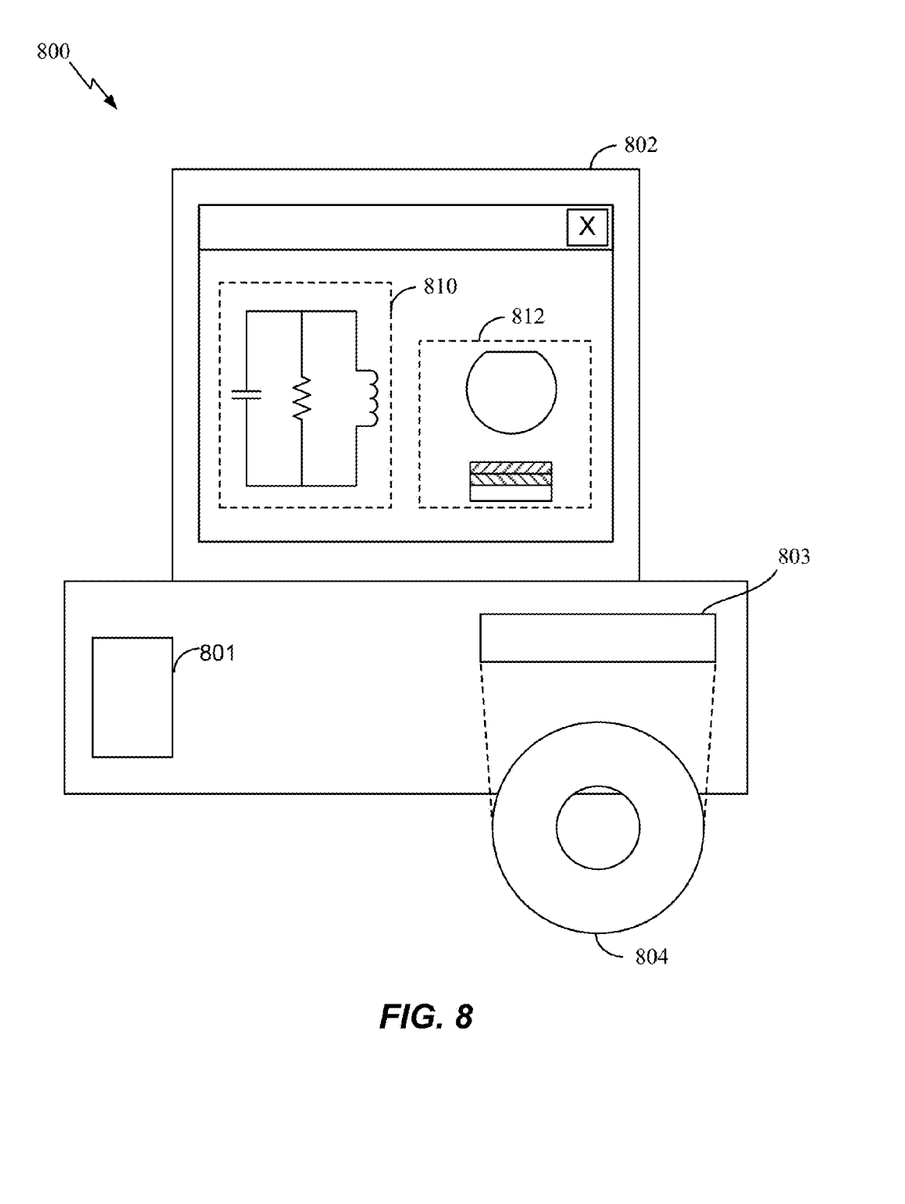
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the MTJ apparatus disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as an MTJ apparatus. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may include specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The exemplary aspects discussed herein, beneficially allow the MTJ stack to be protected from at least the process related damages described above, thereby generating high yield in the fabrication of MTJs. It should be appreciated that the various layers of the MTJ stack are provided merely for illustration and not for limitation. Additional layers may be added and/or layers may be removed or combined and may comprise different materials then illustrated.

It should be appreciated that memory devices including the MTJ storage elements described herein may be included within a mobile phone, portable computer, hand-held personal communication system (PCS) unit, portable data units such as personal data assistants (PDAs), GPS enabled devices, navigation devices, set top boxes, music players, video players, entertainment units, fixed location data units such as meter reading equipment, or any other device that stores or retrieves data or computer instructions, or any combination thereof. Accordingly, aspects of the disclosure may be suitably employed in any device, which includes active integrated circuitry including memory having MTJ storage elements as disclosed herein.

Further, it should be appreciated that various to memory devices can include an array of MTJ storage elements as disclosed herein. Additionally, the MTJ storage elements disclosed herein may be used in various other applications, such as in logic circuits. Accordingly, although portions of the foregoing disclosure discuss the stand alone MTJ storage element, it will be appreciated that various aspects can include devices into which the MTJ storage element is integrated.

Accordingly, aspects can include machine-readable media or computer-readable media embodying instructions which when executed by a processor transform the processor and any other cooperating elements into a machine for performing the functionalities described herein as provided for by the instructions.

While the foregoing disclosure shows illustrative aspects, it should be noted that various changes and modifications could be made herein without departing from the scope of the disclosure as defined by the appended claims. The functions, steps and/or actions of the method claims in accordance with the aspects described herein need not be performed in any particular order. Furthermore, although elements of the aspects may be described or claimed in the singular, the plural is contemplated unless limitation to the singular is explicitly stated.

Although the present disclosure and its advantages have been described in detail, it should be understood that various changes, substitutions and alterations can be made herein without departing from the technology of the disclosure as defined by the appended claims. For example, relational terms, such as "above," "below," "top" and "bottom" are used with respect to a substrate or electronic device. Of course, if the substrate or electronic device is inverted, above becomes below, top becomes bottom and vice versa. Additionally, if oriented sideways, the terms "above," "below," "top" and "bottom" may refer to sides of a substrate or electronic device, for example.

The word "exemplary" is used herein to mean "serving as an example, instance, or illustration." Any aspect described herein as "exemplary" is not necessarily to be construed as preferred or advantageous over other aspects. Likewise, the term "aspects of the disclosure" does not require that all aspects of the disclosure include the discussed feature, advantage or mode of operation. The terminology used herein is for the purpose of describing particular aspects only and is not intended to be limiting of aspects of the disclosure.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An MTJ apparatus, comprising:
    a first conductive hard mask on a second electrode layer, the second electrode layer on a stack of MTJ layers and electrically coupled to the stack of MTJ layers;
    a first spacer on sidewalls of the first conductive hard mask, sidewalls of the second electrode layer, and a surface of the stack of MTJ layers; and
    a second conductive hard mask aligned with sidewalls of the first spacer, the second conductive hard mask on the first conductive hard mask, and the first spacer, in which the second conductive hard mask is arranged to overlap the first conductive hard mask and the second electrode layer and in which lateral dimensions of the stack of MTJ layers are aligned with lateral dimensions of the second conductive hard mask.

2. The MTJ apparatus of claim 1, in which the second conductive hard mask is electrically coupled to the first conductive hard mask.

3. The MTJ apparatus of claim 1, in which the second conductive hard mask is a material in the group consisting of tantalum, hafnium, and platinum.

4. The MTJ apparatus of claim 1, in which the first spacer is between 10 nanometers and 50 nanometers in thickness.

5. The MTJ apparatus of claim 1, in which a first dielectric layer on the first spacer is a SiNx material.

6. The MTJ apparatus of claim 1, further comprising a first electrode layer electrically coupled to the stack of MTJ layers.

7. The MTJ apparatus of claim 6, further comprising a second spacer on the first electrode layer and on the second conductive hard mask.

8. The MTJ apparatus of claim 7, further comprising the second spacer on sidewalls of the stack of MTJ layers, on sidewalls of the first spacer and on sidewalls of the second conductive hard mask.

9. The MTJ apparatus of claim 7, further comprising a second dielectric layer on the second spacer.

10. The MTJ apparatus of claim 9, further comprising a conductive interconnect extending through the second spacer and the second dielectric layer and electrically coupled to the second conductive hard mask.

11. The MTJ apparatus of claim 1 integrated into a mobile phone, a set top box, a music player, a video player, an entertainment unit, a navigation device, a computer, a hand-held personal communication systems (PCS) unit, a portable data unit, and/or a fixed location data unit.

12. An MTJ apparatus, comprising:
   first means for masking a first electrode layer that is coupled to a stack of MTJ layers and for providing a conductive path to the first electrode layer, the first masking means abutting the first electrode layer;
   means for protecting sidewalls of the first means, the protecting means abutting the sidewalls of first means, sidewalls of the first electrode layer, and a surface of the stack of MTJ layers; and
   second means for masking the stack of MTJ magnetic layers and for electrically coupling to the first conductive path, the second means aligned with sidewalls of the first means and abutting a surface of the first means, in which the second means is arranged to overlap the first means and the second electrode layer and in which lateral dimensions of the stack of MTJ layers are aligned with lateral dimensions of the second means.

13. The MTJ apparatus of claim 12 integrated into a mobile phone, a set top box, a music player, a video player, an entertainment unit, a navigation device, a computer, a hand-held personal communication systems (PCS) unit, a portable data unit, and/or a fixed location data unit.

* * * * *